(12) United States Patent
Westbrook et al.

(10) Patent No.: US 8,081,526 B1
(45) Date of Patent: Dec. 20, 2011

(54) SERIALIZED CHIP ENABLES

(75) Inventors: Scott Westbrook, Los Altos, CA (US);
Steven C. Miller, Livermore, CA (US)

(73) Assignee: NetApp, Inc., Sunnyvale, CA (US)

( * ) Notice: Subject to any disclaimer, the term of this patent is extended or adjusted under 35 U.S.C. 154(b) by 535 days.

(21) Appl. No.: 12/238,935

(22) Filed: Sep. 26, 2008

(51) Int. Cl.
*G11C 7/10* (2006.01)

(52) U.S. Cl. .............. 365/191; 365/189.05; 365/233.1; 365/230.05; 711/101

(58) Field of Classification Search .......... 365/191, 365/189.05, 233.1, 230.03; 711/101
See application file for complete search history.

(56) References Cited

U.S. PATENT DOCUMENTS

| | | | | |
|---|---|---|---|---|
| 7,215,591 B2* | 5/2007 | Vernenker et al. | ....... | 365/230.01 |
| 7,619,912 B2* | 11/2009 | Bhakta et al. | ............ | 365/51 |
| 2006/0039205 A1* | 2/2006 | Cornelius | ........ | 365/189.05 |

* cited by examiner

*Primary Examiner* — Tuan T Nguyen
*Assistant Examiner* — Toan Le
(74) *Attorney, Agent, or Firm* — Perkins Coie LLP

(57) ABSTRACT

A method and system for serializing an enable signal designating an electronic device such as a chip to enable or disable in order to reduce the number of pins and physical signal traces required to provide connections for enable signals of multiple electronic devices, such as memory, e.g. Flash and DRAM, is described. The enable signal can be encoded to reduce the number of clock cycles to send the serialized enable signal. A device controller can serialize, encode, and send the enable signal to a decoding module using reduced number of pins and physical connections. Then the decoding module can send a decoded enable signals to individual electronic devices or chips to enable or disable.

21 Claims, 8 Drawing Sheets

SERIALIZED CHIP ENABLES

FIELD OF THE INVENTION

At least one embodiment of the present invention pertains to computer systems with multiple electronic devices or chips, and more particularly, to reduction of the number of pins and physical traces needed to send enable signals to devices such as Flash and DRAM by serializing the enable signal.

BACKGROUND

Computer systems or other electronic circuits typically include multiple electronic devices or chips to provide functionality. In systems where one or multiple devices or chips are enabled or disabled because the devices or chips share a communication bus or for other reasons, it is necessary to provide connections for a device/chip enable signal to each device/chip that needs to be enabled and disabled. One example is a group of memory devices/chips that share a bus in a computer system. "Memory" usually refers to a form of semiconductor storage, such as random access memory (RAM), read-only memory (ROM), flash memory, and other forms of fast but temporary storage. There are many computer memory types, including: 1) volatile memories such as Dynamic Random Access Memory (DRAM), e.g. Double Data Rate Synchronous Dynamic Random Access Memory (DDR SDRAM), and Static Random Access Memory (SRAM); and 2) non-volatile memories such as Read-Only Memory (ROM), e.g. Programmable Read-Only Memory (PROM), Electrically Alterable Programmable Read-Only Memory (EAROM), Erasable Programmable Read-Only Memory (EPROM), Electrically Erasable Programmable Read-Only Memory (EEPROM), and Flash memory. All of these types of memories commonly provide an enable/disable input, for selectively enabling or disabling the device.

To provide an enable signal for multiple memory devices/chips, the same number of physical signal lanes/traces as the number of memory devices/chips can be laid out from a memory controller to memory devices/chips. In the alternative, a buffer chip, e.g. a Complex Programmable Logic Device (CPLD), can be used between a memory controller and the memory devices, with reduced number of physical lanes between the memory controller and the buffer chip. The buffer chip can receive an encoded enable signal from the memory controller and send appropriate enable signals to the memory device based on the decoded enable signal. By encoding the selection of memory device to enable/disable, the number of enable signal traces can be reduced between the memory controller and the buffer chip that is located in relative proximity of the memory devices/chips. Each memory device can be enabled or disabled from the buffer chip output to each memory device.

However, it is desirable to further reduce the number of physical traces of enable signals for a group of memory devices/chips, to reduce cost and complexity of electronic circuit boards.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

A method and system is described for serializing an enable signal designating the address of an electronic device or a chip to enable or disable the device/chip, in order to reduce the number of pins and signal traces required to provide enable signals for multiple electronic devices or chips such as memory, e.g. Flash and DRAM. References in this specification to "an embodiment", "one embodiment", or the like, mean that the particular feature, structure or characteristic being described is included in at least one embodiment of the present invention. Occurrences of such phrases in this specification do not necessarily all refer to the same embodiment.

Serializing an enable signal provides that the enable signals connected to a group of memory chips can share a lane (i.e. a physical connection or trace) instead of using parallel bits on each physical trace. The parallel bits are converted into a serialized form to be sent over multiple clock cycles. This technique can be applied whether the chip address in enable signals are encoded or not encoded. An important objective of the technique introduced here is to reduce the number of physical traces/lanes provided for enable signals in order to reduce the cost and complexity of electrical circuit boards. The technique introduced here allows reducing the number of physical traces from a device controller (e.g. a memory controller), the number of input pins on the buffer chip connected to the device controller, and the number of layers in a PCB for signal routing, thereby reducing the cost of the implementation.

Figure 1:
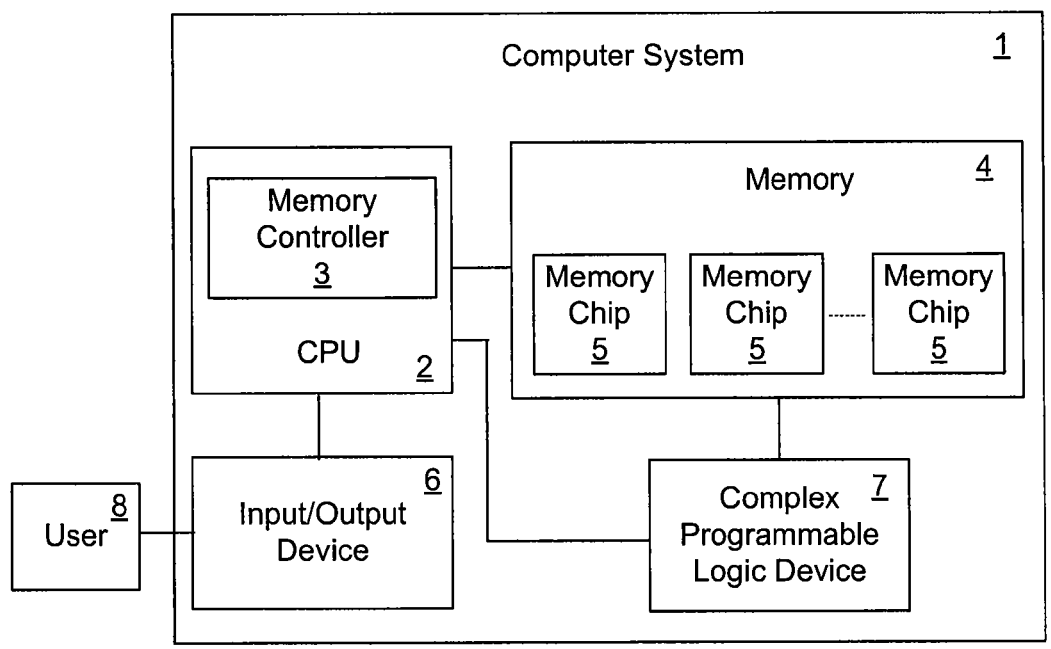
FIG. 1 illustrates a computer system in which the present invention can be implemented.

Refer now to FIG. 1, which illustrates a computer system 1 in which the present invention can be implemented. In general, a computer system 1 includes a Central Processing Unit (CPU) 2, also called a processor, that performs the basic operations (as processing data) of the system, that exchanges data with the system's memory 4 or peripherals, and that manages the system's other components. A memory controller 3 which manages the flow of data going to and from the memory 4 can be part of a CPU 2, as shown in FIG. 1. In another implementation, the memory controller 3 can be a separate component, such as a field-programmable gate array (FPGA).

Memory 4 refers to computer components, devices, and recording media that retain digital data used for computing for some interval of time. There are many kinds of memory 4 that can be used in a computer system 1. Volatile memory, also known as volatile storage or primary storage device, is computer memory 4 that requires power to maintain the stored information, unlike non-volatile memory which does not require a maintained power supply. For example, Random Access Memory (RAM) is usually volatile, and is usually in the form of integrated circuits that allow the stored data to be accessed in any order, i.e. at random. Most forms of modern random access memory are volatile storage, including dynamic random access memory (DRAM) and static random access memory (SRAM). Content addressable memory and dual-ported RAM are usually implemented using volatile storage. Non-volatile memory is typically used for the task of secondary storage, or long-term persistent storage.

Memory 4 includes a group of memory chips 5 that may share a communication bus. Memory 4 can be connected to the memory controller 3 directly and/or can be connected indirectly, such as through a Complex Programmable Logic Device (CPLD) 7 (or other types of a buffer chip). The user 8 can interact with the computer system 1 using one or more input/output devices 6, e.g. a keyboard, a mouse, a display, etc., connected to the CPU.

Figure 2:
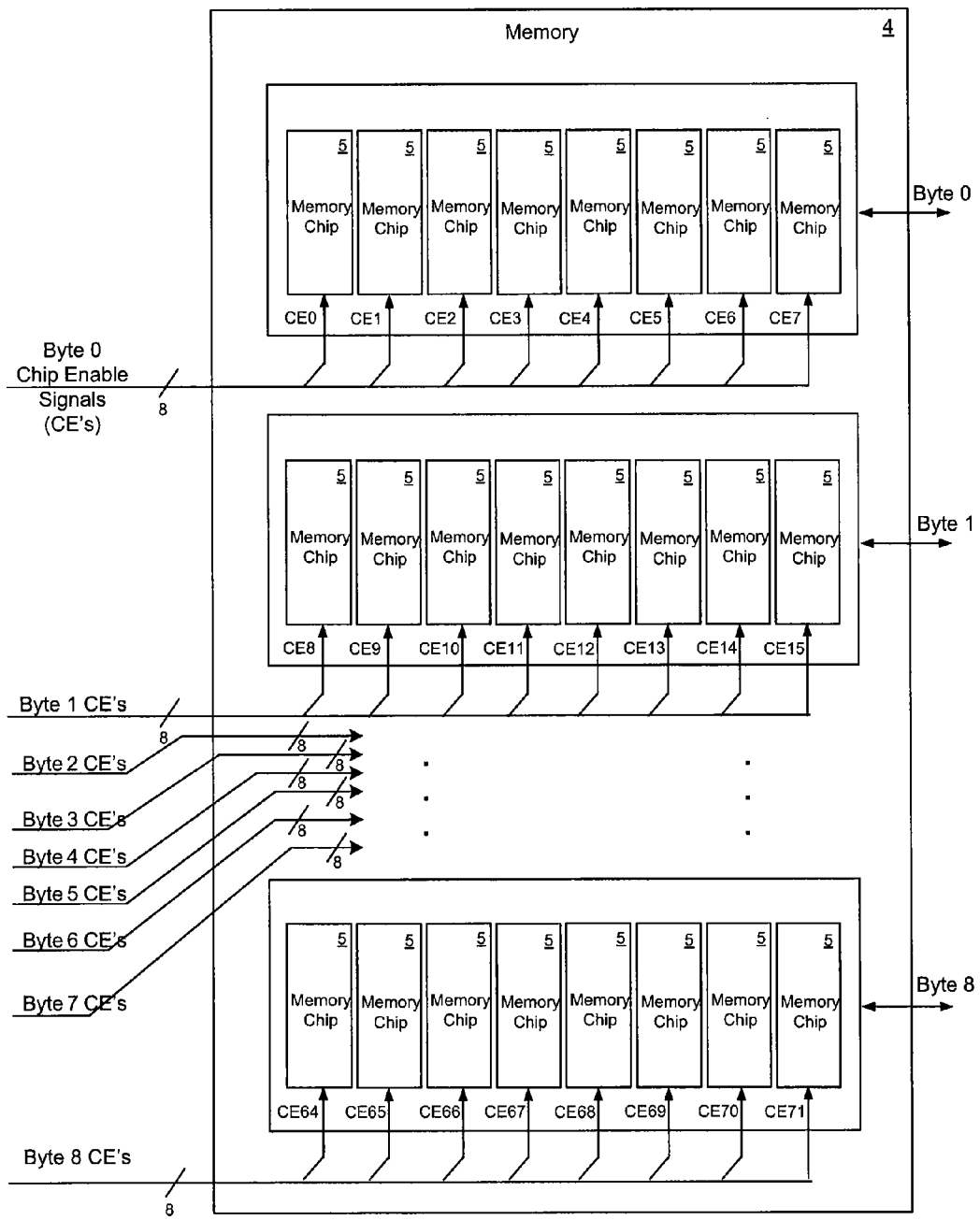
FIG. 2 is a block diagram showing an example of a typical chip enable scheme where individual chip enable signals for memory chips are connected directly to the memory controller.

To enable or disable an individual memory chip 5 in the memory 4 for transporting data to and from the memory 4, individual chip enable signal traces for memory chips 5 can be connected directly to the memory controller 3. FIG. 2 is a block diagram showing an example of a chip enable scheme where individual chip enable signals for memory chips 5 are connected directly to the memory controller 3. In FIG. 2, the chip enable traces for a large bank of memory chips 5 in the memory 4 are gathered up in groups of individual chip enable (CE) traces, where each chip enable trace is connected to a pin on a device connected with the memory controller 3. In this example there would be a total of 72 chip enable signal traces to be connected, because there are nine groups (Byte 0-Byte 8), with eight memory chips for each group.

Figure 3:
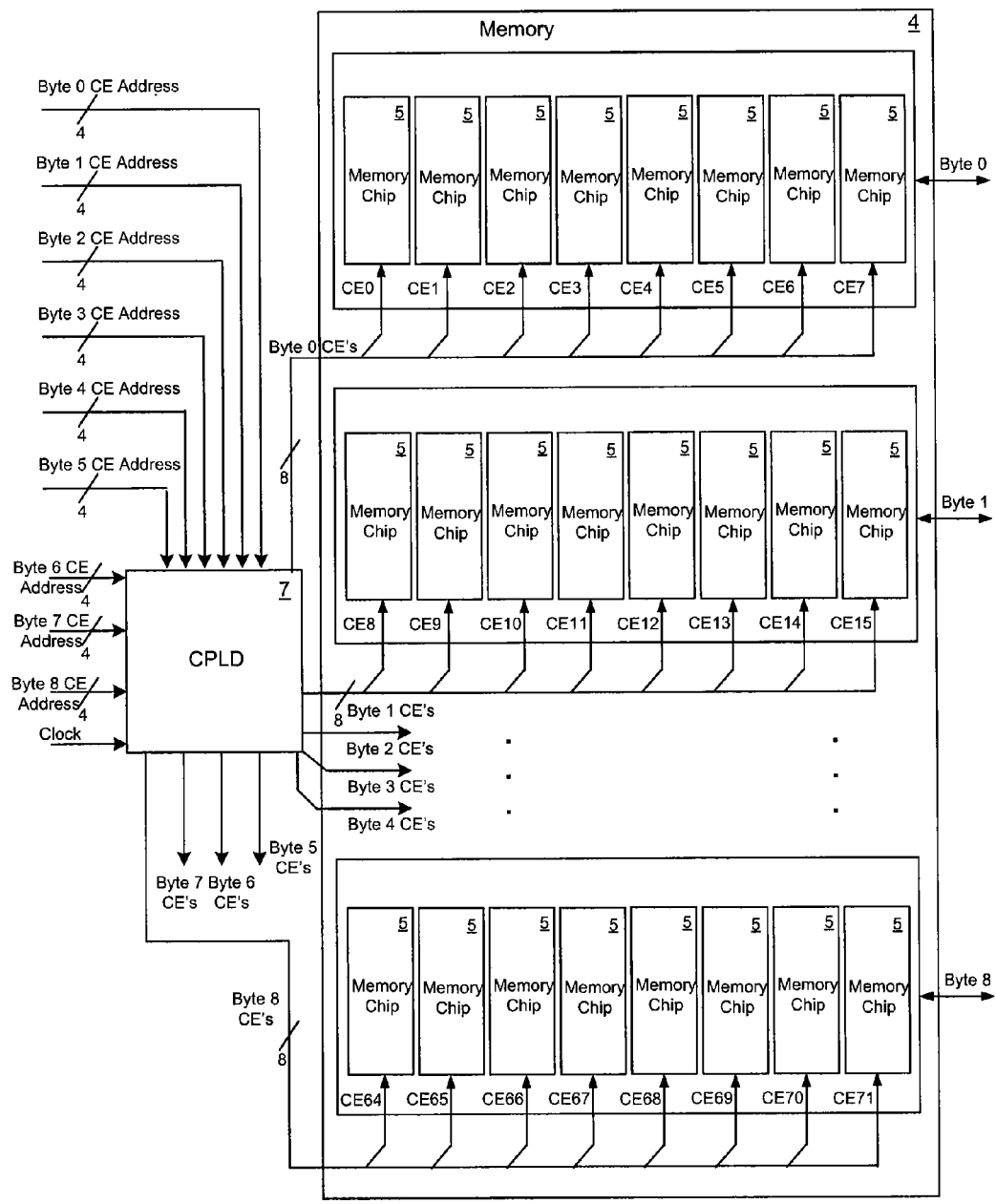
FIG. 3 is a block diagram showing an example of a chip enable scheme reducing the number of connections necessary for chip enable signals by encoding the 8 into a 3 bit binary address for memory chips and using a buffer chip (CPLD)

In each group of eight memory chips 5 in the above example, only one chip enable signal can be active at a time if they share a communication bus. This constraint allows for one possible reduction of connections by encoding the eight memory chip addresses into a three-bit binary address. One additional bit would need to be added as an "enable" bit to make a four-bit code. FIG. 3 illustrates a block diagram showing an example of a chip enable scheme reducing the number of connections necessary for chip enable signals by encoding the eight addresses into a three bit binary address for memory chips and using a buffer chip (e.g., CPLD 7). This can reduce the number of connections (from a memory controller 3 to CPLD 7) in this example from 72 in FIG. 2 to 36 in FIG. 3. Here, the four-bit code for each byte of a nine-byte-wide bank of memory chips is taken into a CPLD 7 where the code is decoded and enabled into the appropriate one of 72 chip enable signals.

However, the above scheme to reduce the number of physical traces is limited by the number of encoded bits for memory chip addresses. Note that the underlying principles of the technique introduced here are potentially applicable to electronic devices other than just memory devices; yet such other electronic devices might not all necessarily have the above-mentioned limitations.

It is desirable to further reduce the number of physical traces of enable signals for a group of memory devices/chips, considering the very limited available space in complex electronic circuit boards. Reducing the number of physical traces from a device controller (e.g. a memory controller 3) also reduces the number of input pins on the buffer chip (e.g. CPLD 7) connected to the device/memory controller, and the number of layers in a PCB for signal routing, thereby reducing the cost of the implementation of memory systems.

Instead of using parallel bits on each physical trace, the enable signals connected to a group of memory chips can share a lane (i.e. a physical connection or trace), where the parallel bits are converted into a serialized form to be sent over multiple clock cycles. This technique will work whether the chip address in enable signals are encoded as in FIG. 3 or not encoded as in FIG. 2. In the following descriptions, it should be noted that the application and implementation of the disclosed technique, including physical implementation and the protocol, can vary from the specific examples described below.

Figure 4:
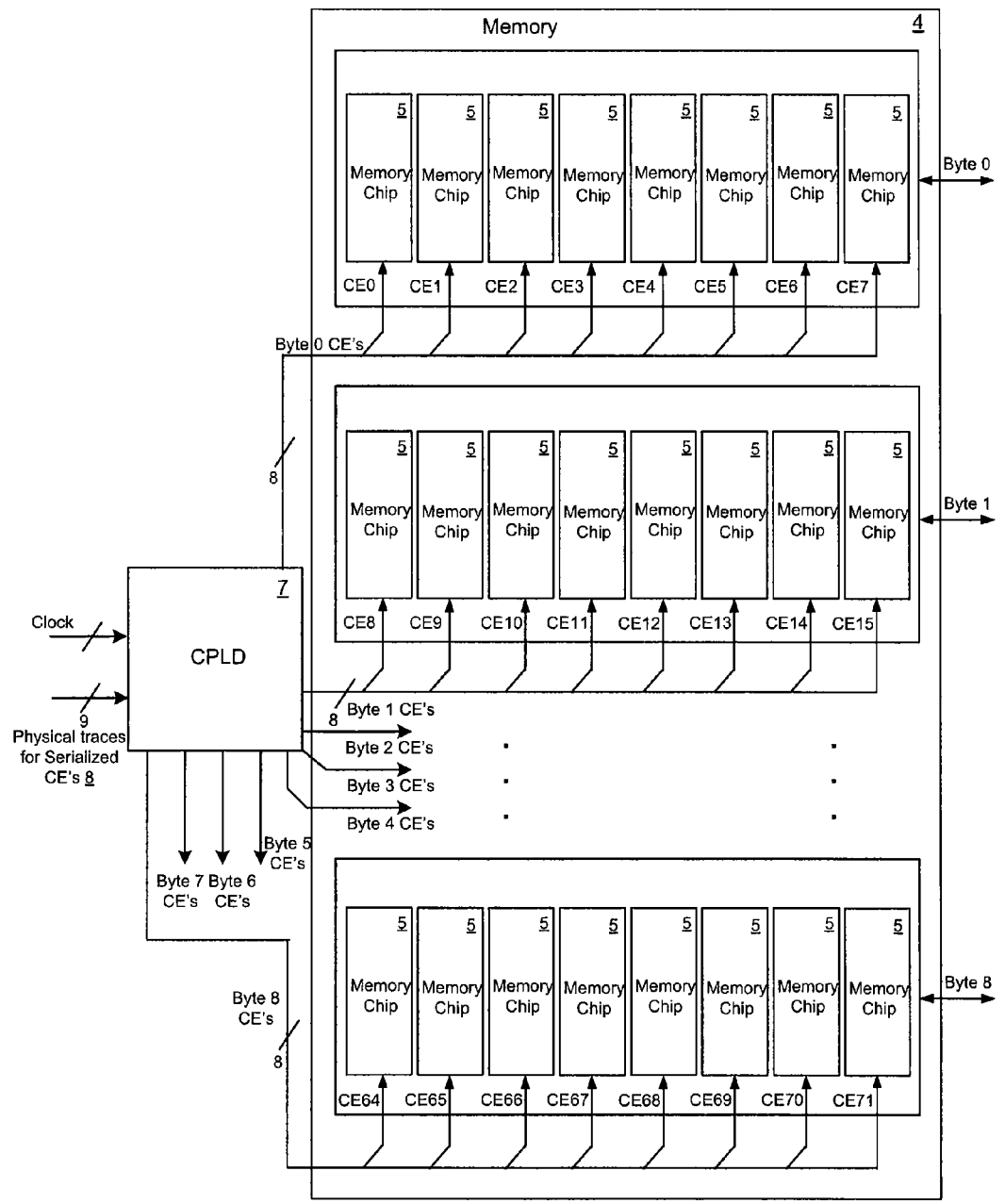
FIG. 4 is a block diagram showing an example of a chip enable scheme using serialized chip enable signals to reduce the number of connections necessary for chip enable signals.

FIG. 4 illustrates a block diagram showing an example of a chip enable scheme using serialized chip enable signals to reduce the number of connections for chip enable signals. There are nine physical traces 8 for serialized chip enable signals input to CPLD 7. Each of the nine physical traces 8 can transport a serialized chip enable signal for the group of eight memory chips assigned to the physical trace. For example, for a non-encoded chip enable signal assigned to a group of eight memory chips, one clock cycle designating a start bit and eight clock cycles designating each memory chip in the group can be used to enable or disable each memory chip. To enable the fifth memory chip (e.g., CE4), the fifth clock cycle after the start clock cycle can be in the enable position ("1" or "0" depending on the logic) with the rest of clock cycles in the disable position ("0" or "1" depending on the logic). This requires nine clock cycles including the start bit and requires a clock input to the CPLD 7 in addition to the serialized chip enable signal lanes.

In FIG. 4, the nine groups of memory chips, with each group having eight memory chips, only use ten (nine chip enable signals and one clock) lanes (physical traces) connected to the input of CPLD 7, compared to seventy-two lanes in FIG. 2 or thirty-six lanes in FIG. 3, thus saving a considerable number of physical connections from the memory controller 3 to CPLD 7. The serialized chip enable technique does use multiple clock cycles, depending on the number of memory chips to which each lane is assigned. However, considering the high speed of communication of electronic circuits, the added number of clock cycles is insignificant compared to the benefit of saving physical resources (e.g., the number of physical connections/traces, the number of PCB layers, the area on the PCB required for the physical traces, etc.).

The number of clock cycles can be reduced by further encoding the serialized chip enable signal, similar to the benefit of using encoded chip addresses from FIG. 2 to FIG. 3. By using a single start bit followed by serialized bits encoding the chip "address" and one bit designating the proper chip enable state, the clock cycles could be reduced to five clock cycles for the above example. Instead of having each of the eight clock cycles designating each memory chip, three clock cycles can represent any one of the eight memory chips in the group.

A special protocol can be used to control the serialized chip enable signals running to each memory device, as briefly indicated above. Since there are nine groups (Byte 0-Byte 8) of Chip Enable (CE) signals on the memory in FIGS. 2-4 and each group has eight chip enables, the memory 4 needs a total of seventy-two independent chip enable signals for each of memory chips 5. None of these chips enables is shared, because each memory chip is expected to operate independently from the others.

In one example of the protocol, the encoded chip enable signal from the memory controller 3 is normally driven high. To initiate a chip enable selection and assertion, this signal is held low for one clock for a start bit. The next three clocks read in the chip enable address (A2, A1, A0). The very next clock will read in the enable state. If the enable state is low, the chip enable indicated by the three address bits is asserted and remain asserted. If a previously asserted chip enable does not match the three address bits, it is de-asserted. If the enable state is always high, there will be no chip enable assertions and any asserted chip enables are de-asserted. At any given time, no more than one chip enable line is enabled on each byte of the memory.

Figure 5A:
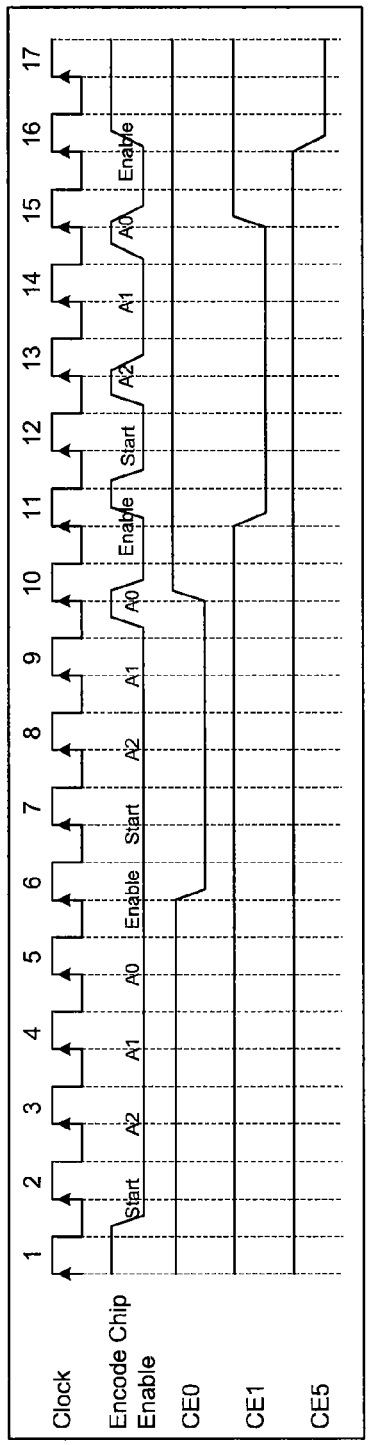
FIG. 5A is a timing diagram showing an example chip enable (CE) signal of asserting multiple chips in succession (CE0, then CE1, then CE5)
Figure 5B:
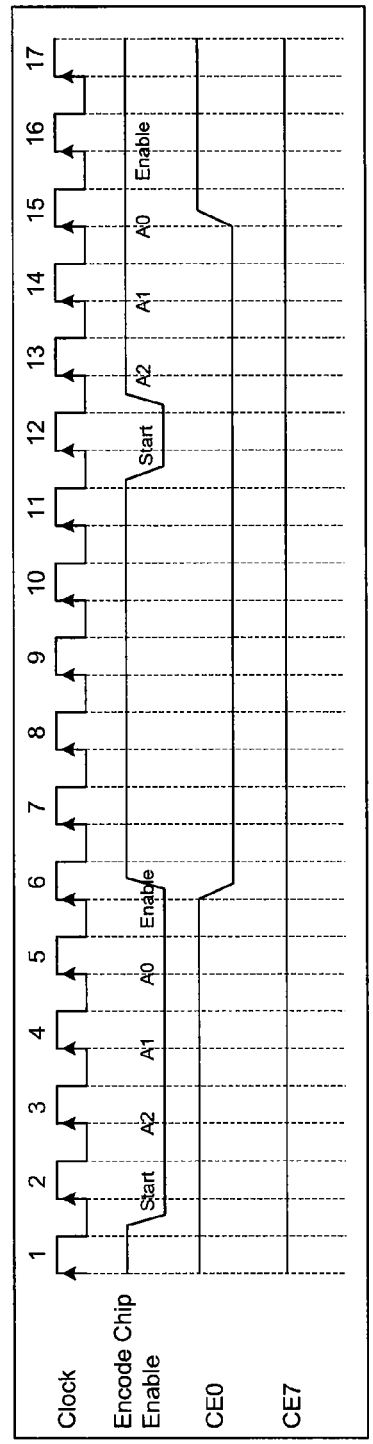
FIG. 5B is a timing diagram showing an example chip enable signal of asserting one chip (CE0), then disabling all chips.
Figure 5C:
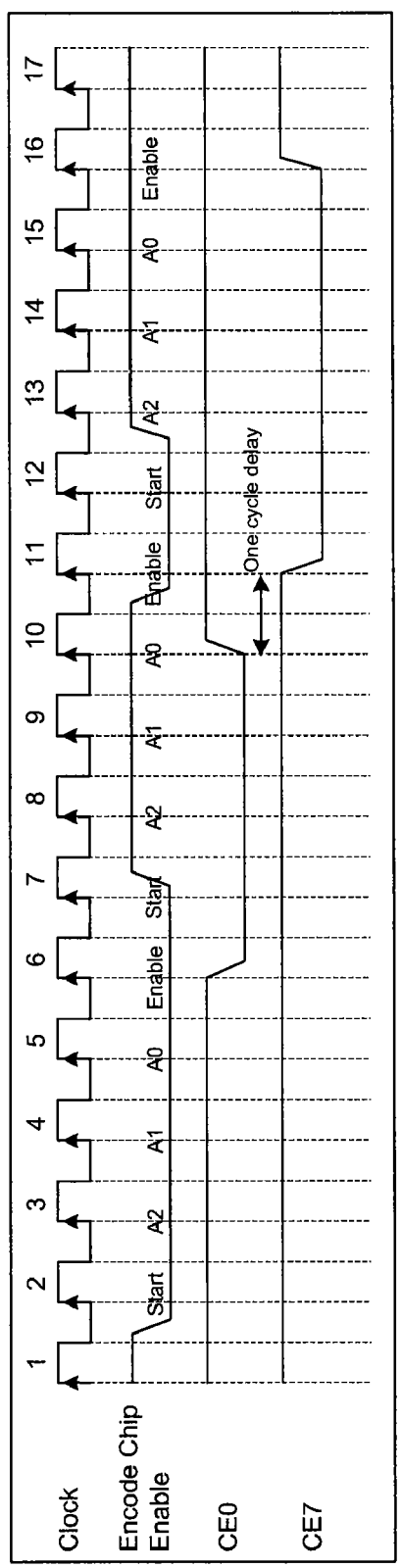
FIG. 5C is a timing diagram showing an example chip enable signal of asserting one chip (CE0), then another (CE7), then disabling the latter (CE7)

FIGS. 5A, 5B, and 5C illustrate the operation of the protocol. FIG. 5A is a timing diagram showing an example chip enable (CE) signal of asserting multiple chips in succession (CE0, then CE1, then CE5). The number after CE specifies the address of each chip in the memory, e.g. 0, 1, 2, ..., 71 for the seventy-two memory chips. The start bit (low) begins at the second clock cycle. Since the following bits A2, A1, and A0 that represent the chip address are all zero, it designates memory chip with the address 0, and the chip enable (CE) signal connected to it is represented as CE0. Since the enable bit at the sixth clock is low, CE0 is enabled (held low) at the sixth clock. The next cycle of address A2, A1, and A0 at the eighth through tenth clocks indicates the chip address of binary 001 or decimal 1 (CE1). The enable state at the eleventh clock indicates low (enable), therefore CE1 is enabled (held low) at the eleventh clock. CE0 is disabled (held high) at the tenth clock because the address designated by the eighth through tenth clocks indicates that the chip with address 0 (CE0) is not selected. The next cycle of address A2, A1, and A0 at the thirteenth through fifteenth clocks indicates the chip address of binary 101 or decimal 5. The enable state at the sixteenth clock indicates low (enable), therefore CE5 is enabled (held low) at the sixteenth clock. CE1 is disabled (held high) at the fifteenth clock because the address designated by the thirteenth through fifteenth clocks indicates that the chip with address 1 (CE1) is not selected.

FIG. 5B is a timing diagram showing an example chip enable signal of asserting one chip (CE0), then disabling all chips. The start bit (low) begins at the second clock cycle. The next cycle of address A2, A1, and A0 at the third through fifth clocks indicates the chip address of binary 000 or decimal 0 (CE0). The enable state at the sixth clock indicates low (enable), therefore CE0 is enabled (held low) at the sixth clock. The next start bit (low) is at the twelfth clock. The address A2, A1, and A0 A2 at the thirteenth through fifteenth clocks indicates the chip address of binary 111 or decimal 7 (CE7). The enable state at the sixteenth clock indicates high (disable), therefore CE7 is kept being disabled (held high). CE0 is disabled (held high) at the fifteenth clock because the address designated by the thirteenth through fifteenth clocks indicates that the chip with address 0 (CE0) is not selected.

FIG. 5C is a timing diagram showing an example chip enable signal of asserting one chip (CE0), then another (CE7), then disabling the latter (CE7). The start bit (low) begins at the second clock cycle. The next cycle of address A2, A1, and A0 at the third through fifth clocks indicates the chip address of binary 000 or decimal 0 (CE0). The enable state at the sixth clock indicates low (enable), therefore CE0 is enabled (held low) at the sixth clock. The next cycle of address A2, A1, and A0 at the eighth through tenth clocks indicates the chip address of binary 111 or decimal 7 (CE7). The enable state at the eleventh clock indicates low (enable), therefore CE7 is enabled (held low) at the eleventh clock. CE0 is disabled (held high) at the tenth clock because the address designated by the eighth through tenth clocks indicates that the chip with address 0 (CE0) is not selected. The next cycle of address A2, A1, and A0 at the thirteenth through fifteenth clocks indicates the chip address of binary 111 or decimal 7 (CE7). The enable state at the sixteenth clock indicates high (disable), therefore CE7 is disabled (held high) at the sixteenth clock.

Figure 6:
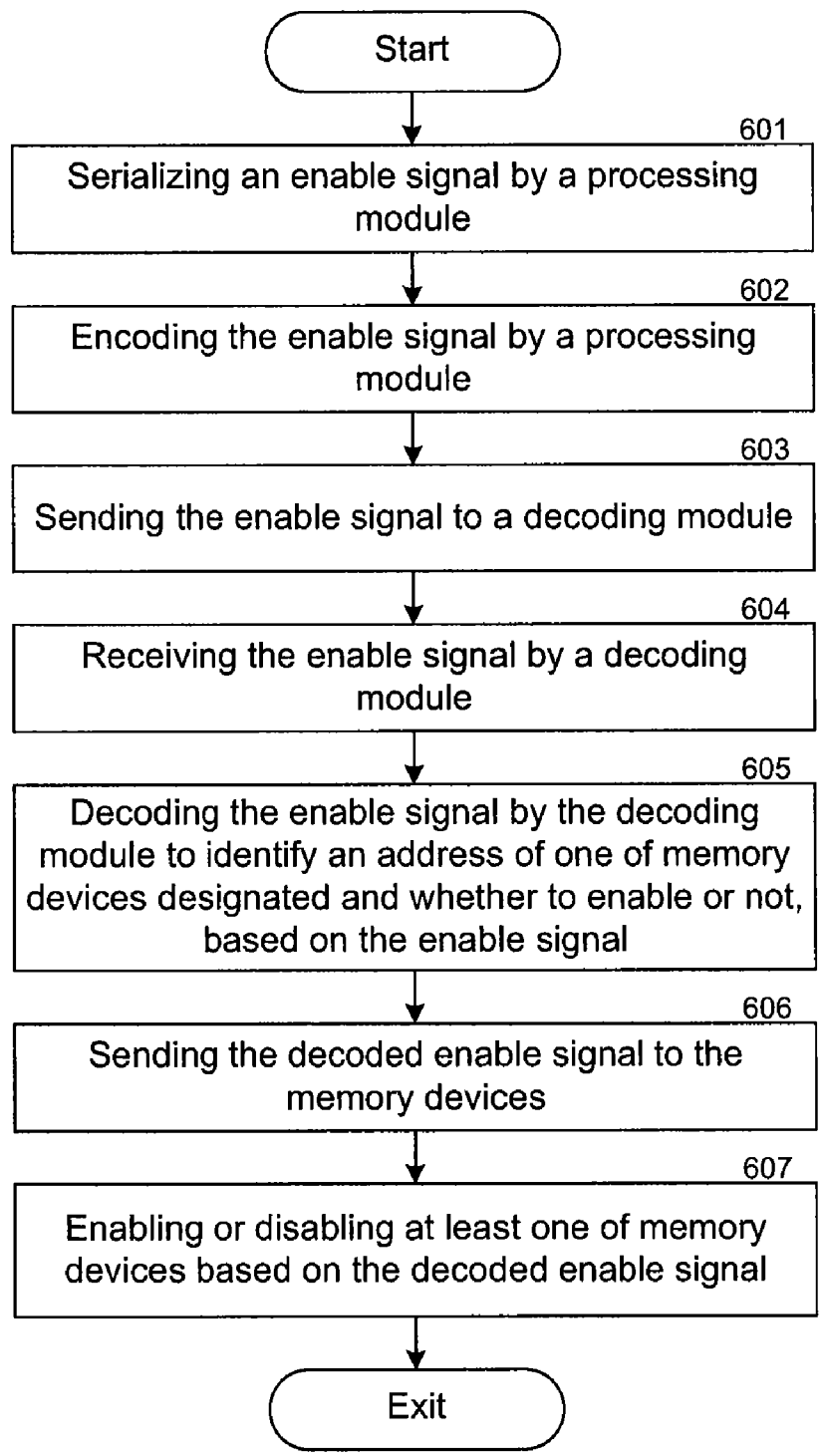
FIG. 6 is a flow diagram showing a process of enabling or disabling a device by serializing and encoding the enable signal.

FIG. 6 is a flow diagram showing a process of enabling or disabling a device by serializing and encoding the enable signal. At 601, a processing module, e.g. a memory controller 3 that can be a part of CPU 2 or a separate component (e.g. FPGA), serializes an enable signal according to the techniques described above. At 602, the processing module encodes the enable signal. As mentioned earlier, serializing an enable signal does not require encoding of the chip address. However, by encoding the device address, the number of clock cycles for the serialized enable signal can be also reduced as explained previously. At 603, the processing module sends the enable signal to a decoding module, e.g. a CPLD 7. At 604, the decoding module receives the enable signal. At 605, the decoding module identifies the address of the designated memory device and determines whether to enable the memory device or not, based on the enable signal. At 606, the decoding module sends the decoded enable signal to the memory devices to enable or disable individual memory devices. At 607, at least one of the memory devices is enabled or not, based on the decoded enable signal.

Figure 7:
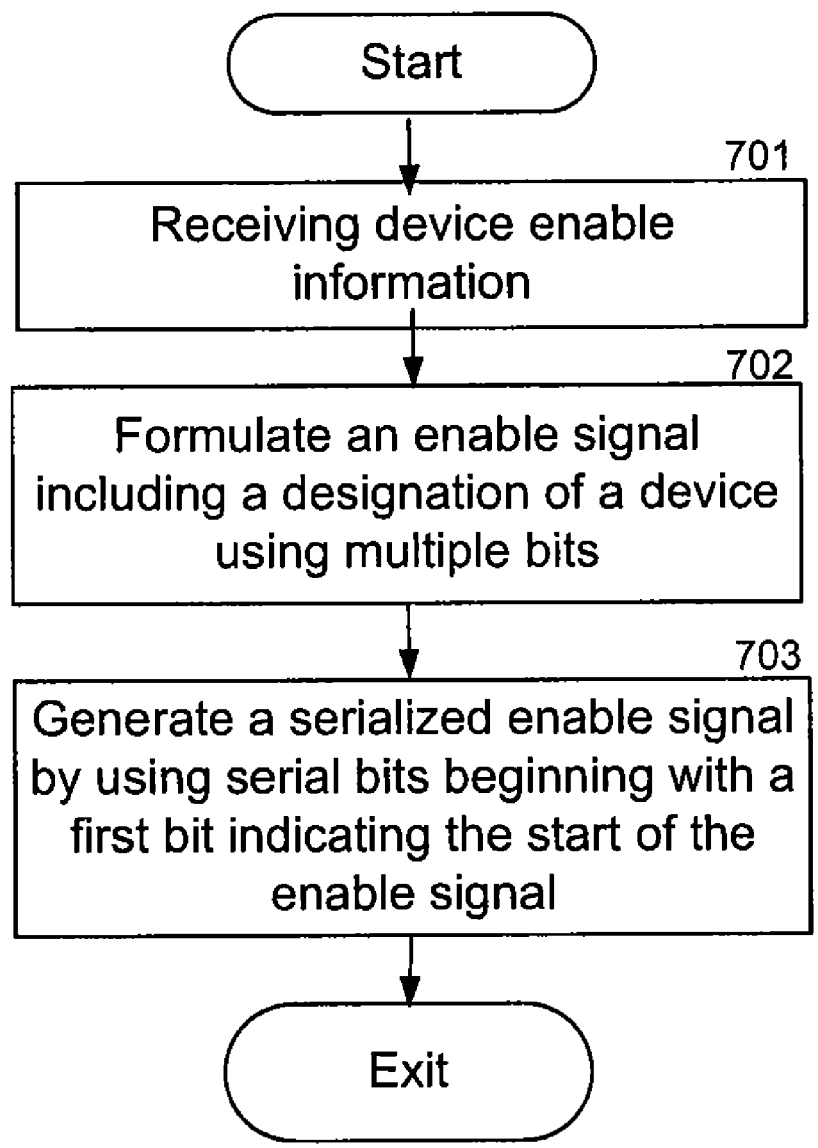
FIG. 7 is a flow diagram showing a process of serializing an enable signal.

FIG. 7 is a flow diagram showing in greater detail an example of the operation 601 of serializing an enable signal. At 701, a processing module (e.g. a memory controller) receives device enable information, e.g., the device address and whether to enable or disable. At 702, the processing module formulates an enable signal including a designation of a device using multiple bits. For example, for a non-encoded chip enable signal assigned to a group of eight memory chips, one of eight sequential bits designating each memory chip in the group can be used to enable or disable each memory chip. To enable the fifth memory chip (e.g., CE4), the fifth bit can be set in the enable position ("1" or "0" depending on the logic) with the rest of the bits in the disable position ("0" or "1" depending on the logic). Encoding the device address can further reduce the number of bits required for the enable signal. For example, the eights bits designating each memory chip in the above example can be encoded to a three-bit address designating one of the eight memory chips, assuming only one memory chip is enabled/disabled at a given time. At 703, the processing module generates a serialized enable signal by using serial bits beginning with a first bit indicating the start of the enable signal. It should be noted that the application and implementation of the disclosed technique, including physical implementation and the protocol can be different from the specific examples described above. For example, the above technique is not limited to a group of memory devices/chips, but can be applied to a group of electronic devices in general. Also, the serialized enable signal can have different structure, e.g., it does not need to have an enable/disable bit if the selected device/chip is always enabled.

Thus, a method and system for serializing an enable signal designating the address of an electronic device or a chip to enable or disable in order to reduce the number of pins and signal traces required to provide enable signals for multiple electronic devices or chips such as memory, e.g. Flash and DRAM, is described. The techniques introduced above can be implemented in special-purpose hardwired circuitry, in software and/or firmware in conjunction with programmable circuitry, or in a combination thereof. Special-purpose hardwired circuitry may be in the form of, for example, one or more application-specific integrated circuits (ASICs), programmable logic devices (PLDs), field-programmable gate arrays (FPGAs), etc.

Software or firmware to implement the techniques introduced here may be stored on a machine-readable medium and may be executed by one or more general-purpose or special-purpose programmable microprocessors. A "machine-readable medium", as the term is used herein, includes any mechanism that provides (i.e., stores and/or transmits) information in a form accessible by a machine (e.g., a computer, network device, personal digital assistant (PDA), manufacturing tool, any device with a set of one or more processors, etc.). For example, a machine-accessible medium includes recordable/non-recordable media (e.g., read-only memory (ROM); random access memory (RAM); magnetic disk storage media; optical storage media; flash memory devices; etc.), etc.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A computer system comprising:
   a plurality of electronic devices;
   a processing module to serialize an enable signal, wherein the enable signal designates an address of an electronic device of the plurality of electronic devices; and
   a decoding module to receive the serialized enable signal from the processing module and to identify the designated address of the electronic device and to determine whether to enable or not, based on the enable signal.

2. The system of claim 1, wherein each of the plurality of electronic devices has a separate corresponding time slot of the serialized enable signal.

3. The system of claim 1, wherein the electronic devices include a plurality of memory chips.

4. The system of claim 1, wherein the plurality of electronic devices share a communication bus.

5. The system of claim 1, wherein the processing module is a memory controller.

6. The system of claim 5, wherein the processing module is a programmable logic device.

7. The system of claim 5, wherein the processing module is a field-programmable gate array (FPGA).

8. The system of claim 5, wherein the processing module is a complex programmable logic device (CPLD).

9. The system of claim 1, wherein the enable signal includes a device enable indicator of whether to enable or disable.

10. The system of claim 1, wherein the enable signal is encoded to reduce a number of clock cycles needed to send the enable signal.

11. The system of claim 1, wherein two or more of the plurality of electronic devices are enabled or disabled based on the device enable signal.

12. A computer system comprising:
    a plurality of memory devices;
    a memory controller to serialize an enable signal, wherein the enable signal designates an address of a memory device of the plurality of memory devices, includes an enable indicator, and has a time duration encompassing multiple clock cycles of a clock used to synchronize electronic components of the computer system, and is further encoded to reduce a number of the clock cycles needed to send the enable signal; and
    a decoding module,
    wherein the memory controller serializes, encodes, and sends the enable signal to the decoding module, the decoding module identifies the address of the memory device and whether to enable or not based on the enable signal, the decoding module sends a decoded enable signal to the plurality of memory chips, and the memory device is enabled or disabled based on the decoded enable signal.

13. The system of claim 12, wherein the plurality of memory devices include a plurality of memory chips.

14. The system of claim 12, wherein the plurality of memory devices share a communication bus.

15. The system of claim 12, wherein the memory controller is a programmable logic device.

16. A method comprising:
    serializing a device enable signal;
    encoding the device enable signal to reduce a number of clock cycles needed to send the device enable signal;
    receiving the serialized device enable signal;
    decoding the serialized device enable signal to identify an address of an electronic device of a plurality of electronic devices; and
    sending a decoded device enable signal to the plurality of electronic devices.

17. The method of claim 16, further comprising enabling or disabling an electronic device of the plurality of electronic devices based on a decoded device enable signal.

18. The method of claim 16, wherein the plurality of electronic devices are memory devices.

19. The method of claim 16, wherein the plurality of electronic devices share a communication bus.

20. A method comprising:
    serializing a chip enable signal;
    receiving the chip enable signal;
    decoding the chip enable signal to identify an address of a memory chip of a plurality of memory chips designated and whether to enable or not, based on the chip enable signal;
    sending a decoded chip enable signal to the plurality of memory chips; and
    enabling or disabling the memory chip based on the decoded chip enable signal.

21. The method of claim 20, further comprising encoding the chip enable signal to reduce a number of clock cycles needed to send the chip enable signal.

* * * * *